(12) United States Patent
van der Heide et al.

(10) Patent No.: US 9,246,017 B2
(45) Date of Patent: Jan. 26, 2016

(54) MEMS-BASED DUAL AND SINGLE PROOF-MASS ACCELEROMETER METHODS AND APPARATUS

(71) Applicant: mCube, Incorporated, San Jose, CA (US)

(72) Inventors: Dolf van der Heide, San Jose, CA (US); Shingo Yoneoka, San Jose, CA (US)

(73) Assignee: mCube, Inc., San Jose, CA (US)

( * ) Notice: Subject to any disclaimer, the term of this patent is extended or adjusted under 35 U.S.C. 154(b) by 149 days.

(21) Appl. No.: 13/761,748

(22) Filed: Feb. 7, 2013

(65) Prior Publication Data

US 2013/0214367 A1 Aug. 22, 2013

Related U.S. Application Data

(60) Provisional application No. 61/596,194, filed on Feb. 7, 2012.

(51) Int. Cl.
*H01L 29/84* (2006.01)
*G01P 15/08* (2006.01)

(52) U.S. Cl.
CPC ............... *H01L 29/84* (2013.01); *G01P 15/08* (2013.01); *G01P 2015/0845* (2013.01); *G01P 2015/0848* (2013.01)

(58) Field of Classification Search
CPC ............... B81B 2201/0235; B81B 2201/025; B81B 2207/015; H01L 29/84; G01P 2015/0848; G01P 2015/0845; G01P 2015/08
USPC ...................... 257/415; 438/50, 460
See application file for complete search history.

(56) References Cited

U.S. PATENT DOCUMENTS 7,578,189 B1* 8/2009 Mehregany ............... 73/514.18
2011/0265574 A1* 11/2011 Yang ........................... 73/658

* cited by examiner

*Primary Examiner* — Kenneth Parker
*Assistant Examiner* — Bo Fan
(74) *Attorney, Agent, or Firm* — Kilpatrick Townsend & Stockton LLP

(57) ABSTRACT

An integrated MEMS inertial sensor device includes one or more three-axis MEMS inertial sensor devices, such as accelerometers, with dual or single proof mass configurations. These designs can be compact and can decouple the motion of each axis to minimize the measurement errors due to cross-axis sensitivity. Some embodiments include a frame to decouple the motion of two axes and to provide geometric symmetry. Some embodiments also include double-folded springs. In a specific embodiment, the three axes of an integrated MEMS accelerometer device are entirely decoupled. Thus, the actuation of each axis, through a force due to acceleration, has little or substantially no effect on the other axes.

15 Claims, 9 Drawing Sheets

MEMS-BASED DUAL AND SINGLE PROOF-MASS ACCELEROMETER METHODS AND APPARATUS

CROSS-REFERENCES TO RELATED APPLICATIONS

The present application claims priority to and incorporates by reference, for all purposes, the following patent application: U.S. Pat. App. No. 61/596,194, filed Feb. 7, 2012.

BACKGROUND OF THE INVENTION

The present invention is directed to applications of integrated circuit (IC) and MEMS (Micro-Electro-Mechanical-Systems) devices. More specifically, embodiments of the invention provide methods and structures for integrated MEMS inertial sensor devices, which can be implemented in mobile phones, tablets, hand-held computers, and the like. Merely by way of example, the MEMS devices can include at least an accelerometer, a gyroscope, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to applications of integrated circuit (IC) and MEMS (Micro-Electro-Mechanical-Systems) devices. More specifically, embodiments of the invention provide methods and structures for integrated MEMS inertial sensor devices, which can be implemented in mobile phones, tablets, hand-held computers, and the like. Merely by way of example, the MEMS devices can include at least an accelerometer, a gyroscope, an inertial sensor, and others. But it will be recognized that the invention has a much broader range of applicability.

In an embodiment, the present invention provides a three-axis MEMS inertial sensor devices, such as accelerometers, with dual or single proof mass configurations. These designs that can be compact and that can decouple the motion of each axis to minimize the measurement errors due to cross-axis sensitivity. Some embodiments include a frame to decouple the motion of two axes and to provide geometric symmetry. Some embodiments also include double-folded springs. In a specific embodiment, the three axes of an integrated MEMS accelerometer device are entirely decoupled. Thus, the actuation of each axis, through a force due to acceleration, has little or substantially no effect on the other axes. Those of ordinary skill in the art will recognize other variations, modifications, and alternatives.

The present invention provides a method and structure for an integrated MEMS inertial sensor device. In an embodiment, the method can include a substrate member having a surface region, at least one proof mass structure, at least one first anchor structure, and at least one first spring structure overlying the surface region. The first spring structure can be coupled to the proof mass structure and the first anchor structure.

In a specific embodiment, the proof mass structure can include a first proof mass member coupled to a first frame structure via at least a second spring structure. The first frame structure can be coupled to the first anchor structure via the first spring structure. The first frame structure can also be configured surrounding the perimeter of the first proof mass member.

In a specific embodiment, the device can also include a second proof mass member, at least one second anchor structure, a second frame structure, and at least one third spring structure overlying the surface region. The second proof mass member can be configured within a center cavity and the second frame structure can be formed within the center cavity of the second proof mass member. The second frame structure can be coupled to the second anchor structure and the proof mass structure can be formed within the second frame structure.

In a specific embodiment, the first, second, and third spring structure can include various spring types and combinations. Each of these can include single beam springs, single folded springs, doubly-folded springs, and others and combinations thereof. These spring structures can also be configured can various arrangements, such as "I", "H", cross, and other shaped arrangements.

In a specific embodiment, the first proof mass can be configured within a center cavity. The first frame structure and the first anchor structure can be configured within this center cavity. The first proof mass structure, the first anchor structure, and the first and second spring structures can be configured in a geometrically symmetric or anti-symmetric arrangement. The first and second spring structures can also be configured in a rectangular arrangement within a vicinity of the perimeter of the proof mass structure.

In a specific embodiment, the device can include at least one electrode structure coupled to the surface region. An IC layer can also be configured overlying the surface region, the IC layer being electrically coupled to the electrode structure. The electrode structure can include a differential electrode pair. The proof mass structure can also include with a plurality of electrode cavities. The electrode structure can include a plurality of differential electrode pairs, and each of these pairs can be configured within each of the electrode cavities.

Many benefits are achieved by the way of the present invention over conventional techniques. In a specific embodiment, the present invention provides integrated MEMS inertial sensor devices based on parallel folded spring elasto-kinematics designs. The various embodiments described throughout the detailed description use spring designs and geometric symmetry to minimize, or even substantially eliminate, cross-sensitivity and parasitic coupling among the three axes. These designs can include configurations that are compact while maintaining axes decoupling. The resulting device can be compact, substantially error-free, and can provide acceleration measurements for multiple decoupled degrees of freedom.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to applications of integrated circuit (IC) and MEMS (Micro-Electro-Mechanical-Systems) devices. More specifically, embodiments of the invention provide methods and structures for integrated MEMS inertial sensor devices, which can be implemented in mobile phones, tablets, hand-held computers, and the like. Merely by way of example, the MEMS devices can include at least an accelerometer, a gyroscope, an inertial sensor, and others. But it will be recognized that the invention has a much broader range of applicability.

In an embodiment, the present invention provides a three-axis MEMS inertial sensor devices, such as accelerometers, with dual or single proof mass configurations. These designs that can be compact and that can decouple the motion of each axis to minimize the measurement errors due to cross-axis sensitivity. Some embodiments include a frame to decouple the motion of two axes and to provide geometric symmetry. Some embodiments also include double-folded springs. In a specific embodiment, the three axes of an integrated MEMS accelerometer device are entirely decoupled. Thus, the actuation of each axis, through a force due to acceleration, has little or substantially no effect on the other axes. Those of ordinary skill in the art will recognize other variations, modifications, and alternatives.

In various embodiments, the present invention provides integrated MEMS inertial sensor devices based on parallel folded spring elasto-kinematics designs. The motion of an inertial sensor device, such as an accelerometer, is not completely characterized by kinematics; it is strongly dependent on elastic deformations as well. The various embodiments described below use spring designs and geometric symmetry to minimize, or even substantially eliminate, cross-sensitivity and parasitic coupling among the three axes. These designs can include configurations that are compact while maintaining axes decoupling. The resulting device can be compact, substantially error-free, and can provide acceleration measurements for multiple decoupled degrees of freedom.

In a specific embodiment, X and Y axes are defined to be in-plane axes and the Z axis is defined as the out-of-plane axis. Typical performance parameters for three-axis accelerometers based on parallel folded spring designs can include the following:

No rotation of the proof-mass with respect to ground—the spring mechanism should only allow for pure X and Y translations in the place of the proof-mass.

No parasitic coupling between the X and Y degrees of freedom (DOFs)—a load in the X axis direction should produce motion in the X direction only, and ideally no motion in the Y direction. Any Y motion produced in the proof-mass due to an X force is termed 'parasitic error' or 'parasitic coupling, and has to be eliminated. The same holds for other axes.

Figure 1:
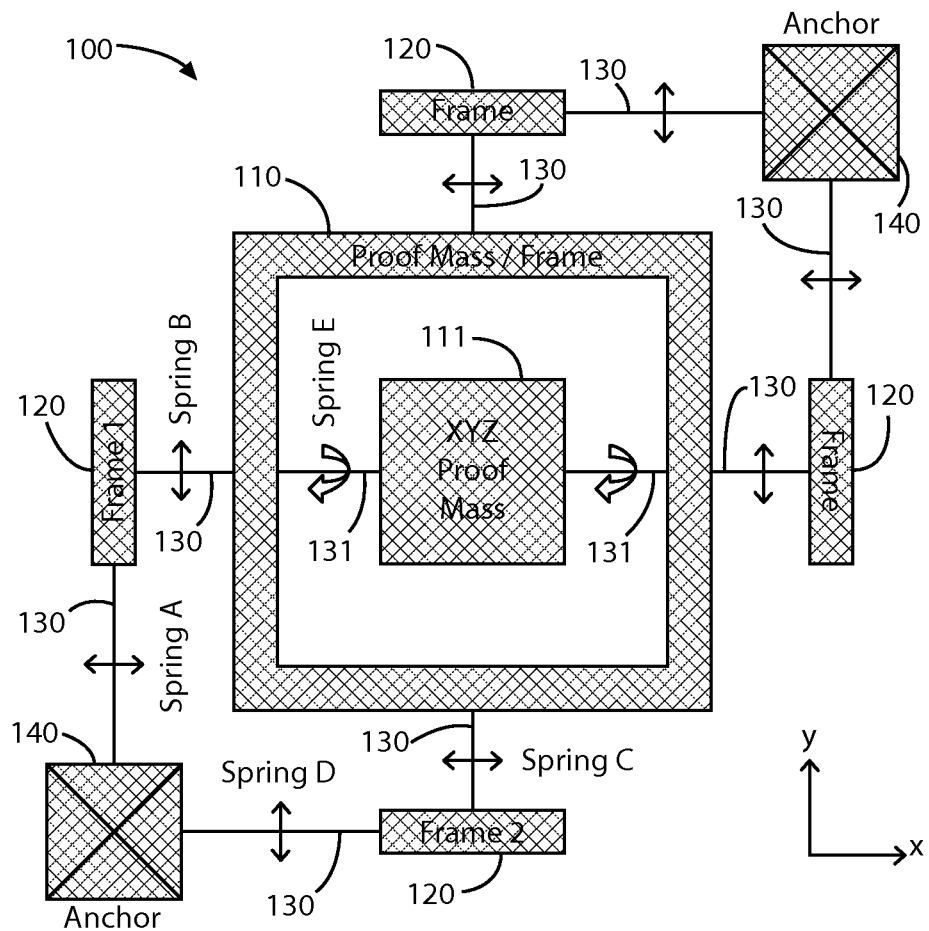
FIG. 1 is a simplified diagram of a top view of an integrated MEMS inertial sensor device according to an embodiment of the present invention.

FIG. 1 illustrates a simplified diagram of an integrated MEMS inertial sensor device according to an embodiment of the present invention. As shown, device 100 can include one or more proof masses 110 and 111, one or more frame structures 120, one or more spring structures 130 and 131, and one or more anchor structures 140. Proof masses 110 and 111 can be coupled by one or more of springs 130. Proof mass 110 can be coupled to frame structures 120 by additional spring structures 130. Also, frame structures 120 can be coupled to anchor structures 140 by spring structures 130. FIG. 1 shows a specific embodiment of an integrated MEMS inertial sensor device, further described below.

Device 100 of FIG. 1 illustrates the rigid and compliant units that the desired spring mechanism must be comprise in order to meet the previously described performance objectives. There are three rigid parts: anchors 140 or ground, the proof-mass 110, and frames 120. The proof-mass is required to have two translational degrees of freedom with respect to the anchors. In addition, a smaller proof-mass 111, which may pivot about one of the planar axes (X or Y) is attached to the proof-mass 110 (which can also function as a frame) by springs 131 and can be configured inside the proof-mass 110. This proof-mass configuration can provide a teeter totter structure, providing measurements of the acceleration in the Z direction. In a specific embodiment, device 100 is configured as a symmetric one proof-mass design, wherein proof mass 111 is an XYZ proof mass.

The frames 120 are necessary to decouple the motion of the two axes. The rigid parts are connected to each other by means of springs 130, which act as frictionless bearings and provided constraints to relative motion. Each spring A, B, C, D, and E is a single degree of freedom mechanism that only allows translation (or rotation) in the direction shown by the double-sided arrow.

The anchor is connected to frame 1 by means of spring A, which only allows for relative motion along the X direction and constrains all other degrees of freedom. This implies that, no matter what the overall configuration of the entire mechanism is, frame 1 will always have a pure X displacement with respect to ground.

Frame 1 and the proof-mass are connected by means of spring B that allows for relative motion in the Y direction only and constrains relative motion along the X direction, as well as rotational motion. This implies that the X motion of Frame 1 will be entirely transmitted to the proof-mass, while any Y motion of the proof-mass will not be seen by frame 1 at all. Spring A provides the linear guide/bearing of X actuator force. Furthermore, any X force applied at frame 1 is incapable of producing any Y motion of the proof-mass due to the presence of spring B.

Along similar reasoning, frame 2 is connected to ground by means of spring D, which constrains motion in the X direction and rotation, but allows for perfect relative motion in the Y direction. Thus, frame 2 can only move along the Y-axis direction and shall have no motion in the X direction or rotation, no matter what the displacement of the proof-mass is.

Frame 2 and the proof-mass are connected via spring C, which allows only X motion between the two. Thus, any X motion at the proof-mass will not affect frame 2. So in any deformed configuration of the accelerometer, frame 1 always has a pure X displacement while frame 2 has a pure Y displacement. The proof-mass inherits the X displacement of frame 1 and the Y displacement of frame 2, thus acquiring two translational degrees of freedom. Since all the connecting springs constrain rotation, the rotation of the proof-mass is constrained with respect to ground.

Springs A, B, C, and D are idealized single degree of freedom guides. The only degree of freedom that spring A and C allow for is relative translation along X, while spring B and D are compliant only in relative translation along Y. The arrangement of these springs is such that there is no overconstraint in the overall accelerometer. With such geometric arrangements and idealized spring units (A-D), parasitic coupling between the two axes (X and Y) and rotation of the proof-mass can be substantially eliminated. Also, rotation of the frame or proof-mass is further minimized due to the presence of extra rotational constraints arising from additional springs. Those of ordinary skill in the art will recognize other variations, modifications, and alternatives.

Figure 2:
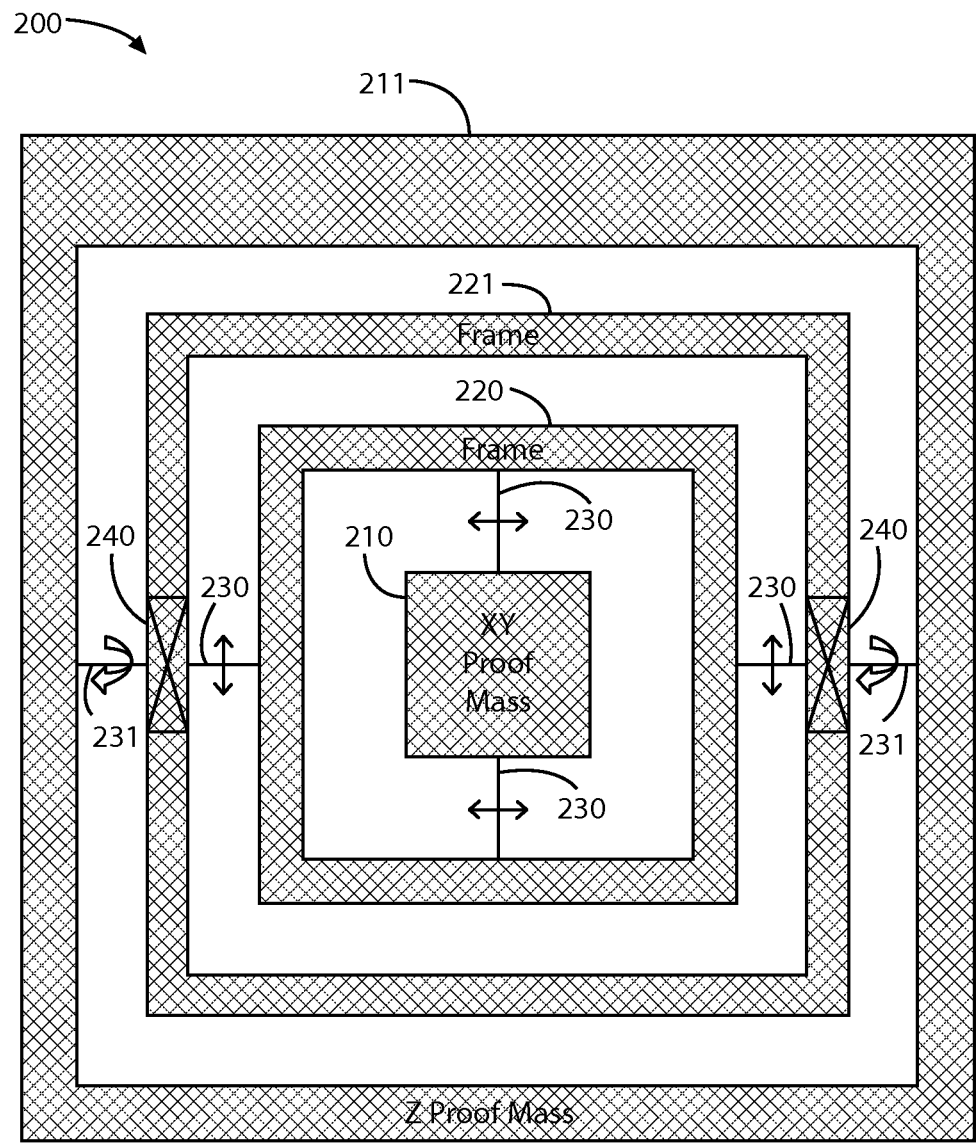
FIG. 2 is a simplified diagram of a top view of an integrated MEMS inertial sensor device according to an embodiment of the present invention.
Figure 3:
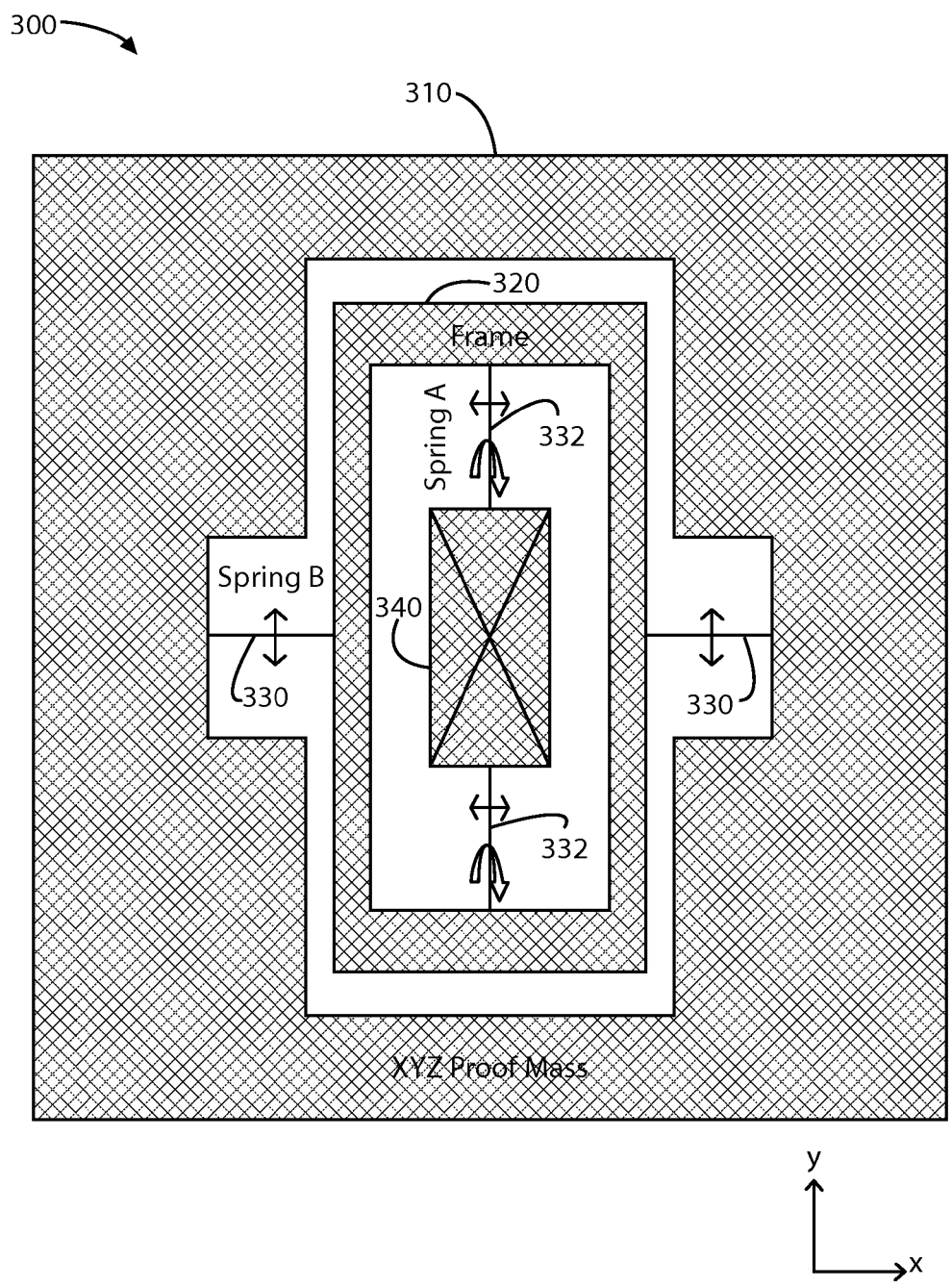
FIG. 3 is a simplified diagram of a top view of an integrated MEMS inertial sensor device according to an embodiment of the present invention.

FIGS. 2 and 3 show alternative embodiments of the same principle described above for FIG. 1. FIG. 2 illustrates a simplified diagram of an integrated MEMS inertial sensor device according to an embodiment of the present invention. As shown, device 200 can be a two proof-mass design including one or more proof masses 210 and 211, one or more frame structures 220 and 221, one or more spring structures 230 and 231, and one or more anchor structures 240. Proof mass 210, which can be an XY proof mass, can be coupled to one of frames 220 by one or more frames 230. This frame 220 can be coupled to frame 221 by additional springs 230. Frame 221 can also be coupled to anchors 240 and to proof mass 211, which can be a Z proof mass, by springs 231.

FIG. 2 can represent an embodiment with concentrically configured proof masses and frame structures. Proof mass 210 can be connected to frame 220 by springs 230 configured to allow translation along the X-axis. Frame 220 can be coupled to frame 221 by springs 231 configured to allow translation along the Y-axis. In a specific embodiment, proof mass 210 and frame 220 can be configured as can be an XY proof mass. Frame 221 can also be coupled to the anchors 240. Proof mass 211 can be a Z proof mass, which is coupled by springs 231 to anchors 240. Springs 231 can allow rotational translation about the X-axis, allowing displacement in the Z direction. The Z proof mass can be a teeter totter structure. Of course, there can be other variations, modifications, and alternatives.

FIG. 3 illustrates a simplified diagram of an integrated MEMS inertial sensor device according to an embodiment of the present invention. As shown, device 300 is configured in another single proof mass design, which can include a proof mass 310, a frame structure 320, one or more spring structures 330 and 332, and an anchor structure 340. Anchor 340 can be coupled to frame 320 by springs 332 and frame 320 can be coupled to proof mass 310 by springs 330. In FIG. 3, the frame 320 and anchor 340 is connected through spring A that allows the relative motion in X axis and rotation. Springs 332 can allow translation in the X direction as well as rotation about the X axis, allowing displacement in the Z direction. Frame 320 is also connected through spring B to the proof mass 310, which can be an XYZ proof mass. Also, spring B allows translation in the Y direction.

Figure 4:
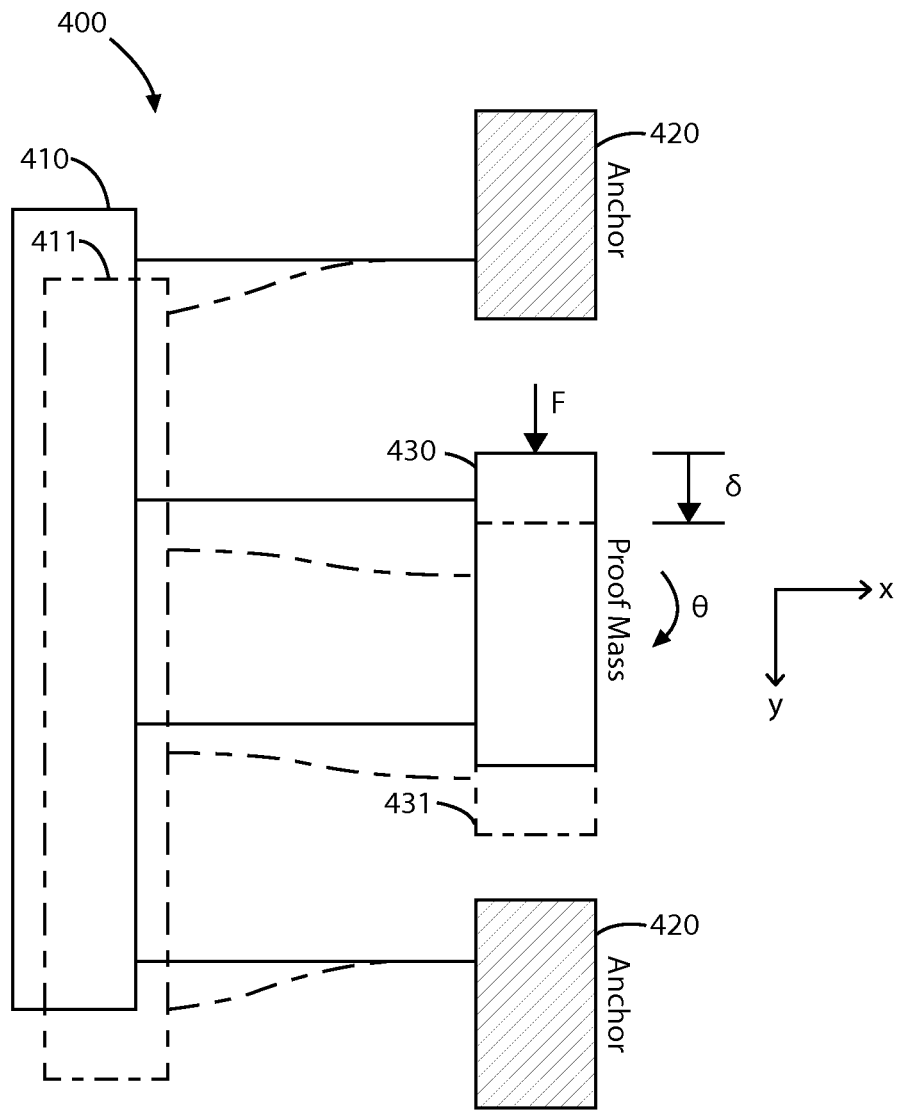
FIG. 4 is a simplified diagram of a top view of a spring structure according to an embodiment of the present invention.

FIG. 4 illustrates a simplified diagram on a spring structure according to an embodiment of the present invention. As shown, structure 400 can include a spring member 410 coupled to anchors 420 and a proof mass 430. In some embodiments, double folded springs are implement to realize X or Y translational motion with minimum parasitic motion. The canonical design of the doubly folded spring is shown in FIG. 4, where deformed (dotted lines) and un-deformed (solid lines) geometries are shown. When proof mass 430 is displaced to 431, spring 410 is deformed to 411.

Beam bending analysis can be used to predict the force-deformation characteristics of this flexure. It can be analytically shown that the parallelogram spring offers little resistance to relative motion in the Y direction, but is very stiff with respect to relative motion in the X direction, as well as rotation. Therefore, this spring can be a much better approximation for a single DOF spring as compared to the single beam.

As noted in the analytical expressions, the parallelogram flexure unit does suffer from undesirable parasitic errors. An application of force in the Y direction results in the desired motion $\delta$, in the Y direction, and also in undesired motions: $\epsilon$ in the negative X direction, and rotational twist $\ominus$. While $\ominus$ may be eliminated by appropriate placement of the force F, $\epsilon$ is always present. Due to these characteristics, the use of this spring configuration may depend on the desired application.

FIGS. 5-8 show examples of accelerometer devices that are designed based on various embodiments of the present invention. The embodiments shown in FIGS. 5-8 represent various embodiments shown previously in FIGS. 1-3. Double-folded beams are implemented for the springs in X or Y translational motion to minimize parasitic motion.

Figure 5:
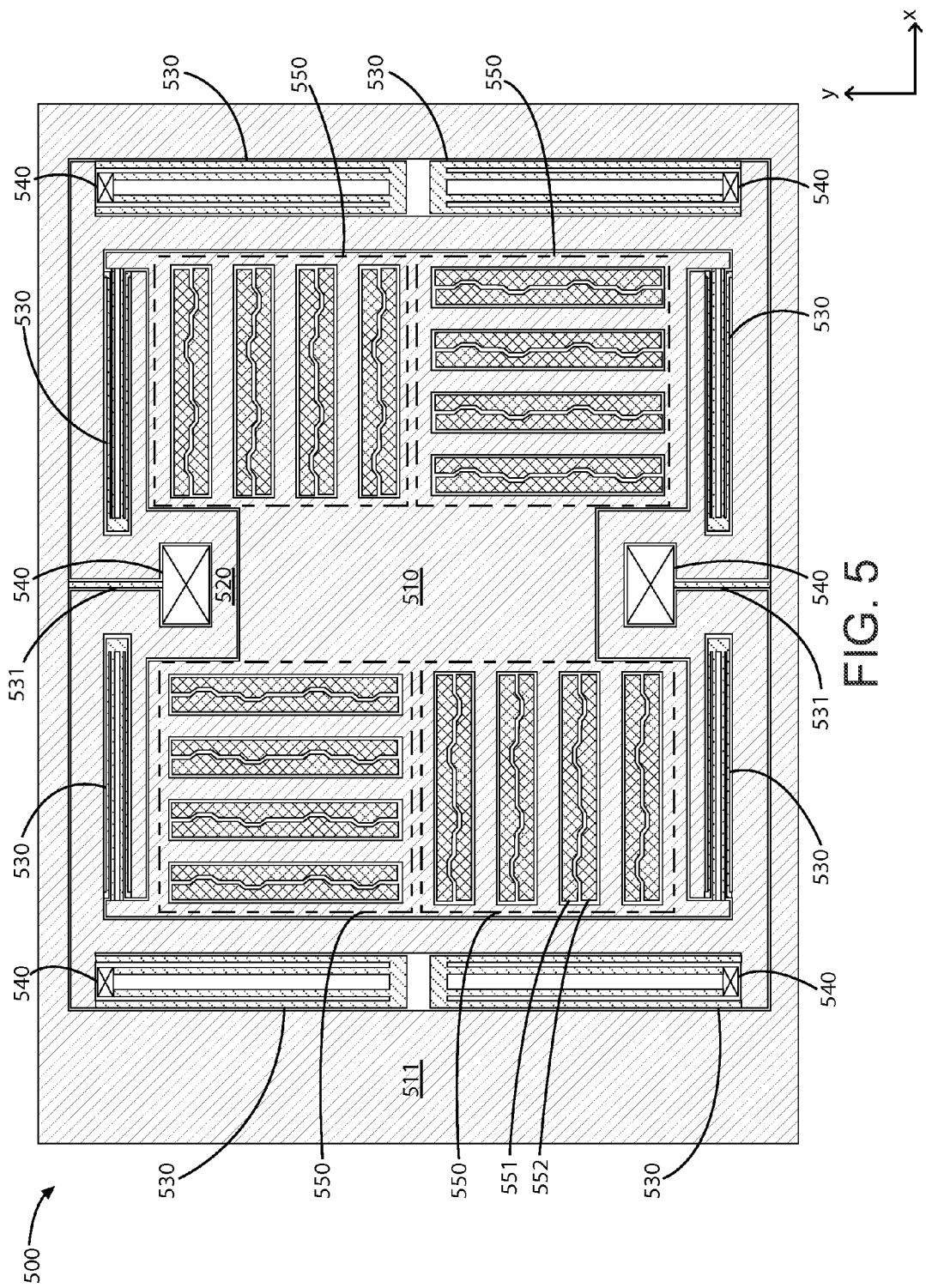
FIG. 5 is a simplified diagram of a top view of an integrated MEMS inertial sensor device according to an embodiment of the present invention.

FIG. 5 illustrates a simplified diagram of a top view of an integrated MEMS inertial sensor device according to an embodiment of the present invention. As shown, device 500 can include proof masses 510 and 511, a frame structure 520, spring structures 530 and 531, anchor structures 540, and electrodes 550. Device 500 can represent an embodiment similar to that shown in FIG. 2. Proof masses 510 and 511 can be configured together to form a teeter totter structure, as described for proof masses 110 and 111 of FIG. 1. These can be coupled by spring structures 530 to each other, to frame 520, and to anchors 540. Various specific embodiments are described below.

Spring structures 530 and 531 can be configured in various positions to facilitate translational or rotation motion along different axes. As shown in FIG. 5, spring structures 530 may only allow translational motion in the X or Y direction. These spring structures 530 can include single beam spring structures, single folded spring structures, doubly folded spring structures, or other spring structures, and combinations thereof. The configuration of FIG. 5 shows the spring structures 530 being configured in a perimeter region surrounding the proof mass 510. In a specific embodiment, the springs 531 connected to anchors 540 can be single beam springs, whereas the other springs can be doubly-folded springs.

Electrodes 550 can be configured in various positions to sense translational or rotational motion (X-Y-Z axes) of the proof masses. These electrodes 550 can be grouped and positioned symmetrically as shown. Each electrode element can include an electrode pair with a first electrode 551 and a second electrode 552, which can provide a differential configuration. These electrodes 550 can be sense electrodes, test electrodes, or others. As shown, electrodes 550 are arranged in groups of four, with two groups configured parallel to the x-axis and two groups configured parallel to the y-axis. There can be other variations, modifications, and alternatives.

Figure 6:
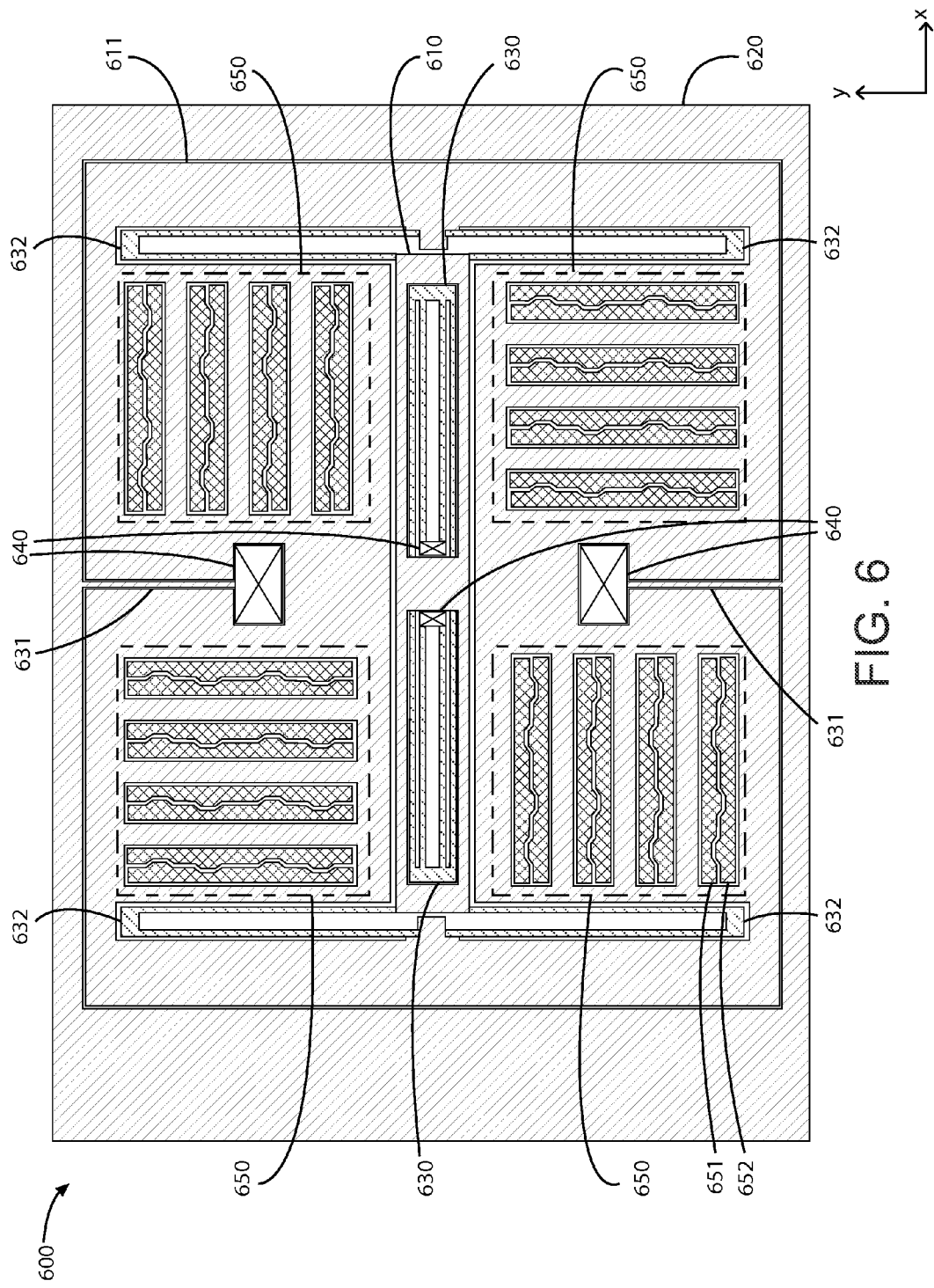
FIG. 6 is a simplified diagram of a top view of an integrated MEMS inertial sensor device according to an embodiment of the present invention.

FIG. 6 illustrates a simplified diagram of a top view of an integrated MEMS inertial sensor device according to an embodiment of the present invention. As shown, device 600 can include proof masses 610 and 611, a frame structure 620, spring structures 630 and 631 and 632, anchor structures 640, and electrodes 650. Device 600 can represent an embodiment similar to the two proof mass device shown in FIG. 2. Various specific embodiments are described below.

Proof mass 611 can be a Z proof mass configured as a teeter totter structure, similar to proof mass 211 in FIG. 2. The Z proof mass can be coupled to anchors 640 by springs 631, which can be single beam springs. Proof mass 610 can be coupled to springs 630, which can be doubly-folded springs coupled to anchors 640. Proof mass 610 can also be coupled to frame 620 by springs 632, which can be single folded springs.

Here, the doubly-folded springs 630 are configured parallel to the x-axis along the center of device 600. The single beam springs 631 are configured parallel to the y-axis and coupled to the anchors 640 along the center of device 600. And single folded springs 632 are configured parallel to the y-axis along the perimeter of frame 620. Of course, there can be other variations, modifications, and alternatives.

Electrodes 650, which can include differential electrode members 651 and 652, can be configured as sense electrodes, test electrodes, and the like. These electrodes can be similar to those described for electrodes 550 in FIG. 5.

Figure 7:
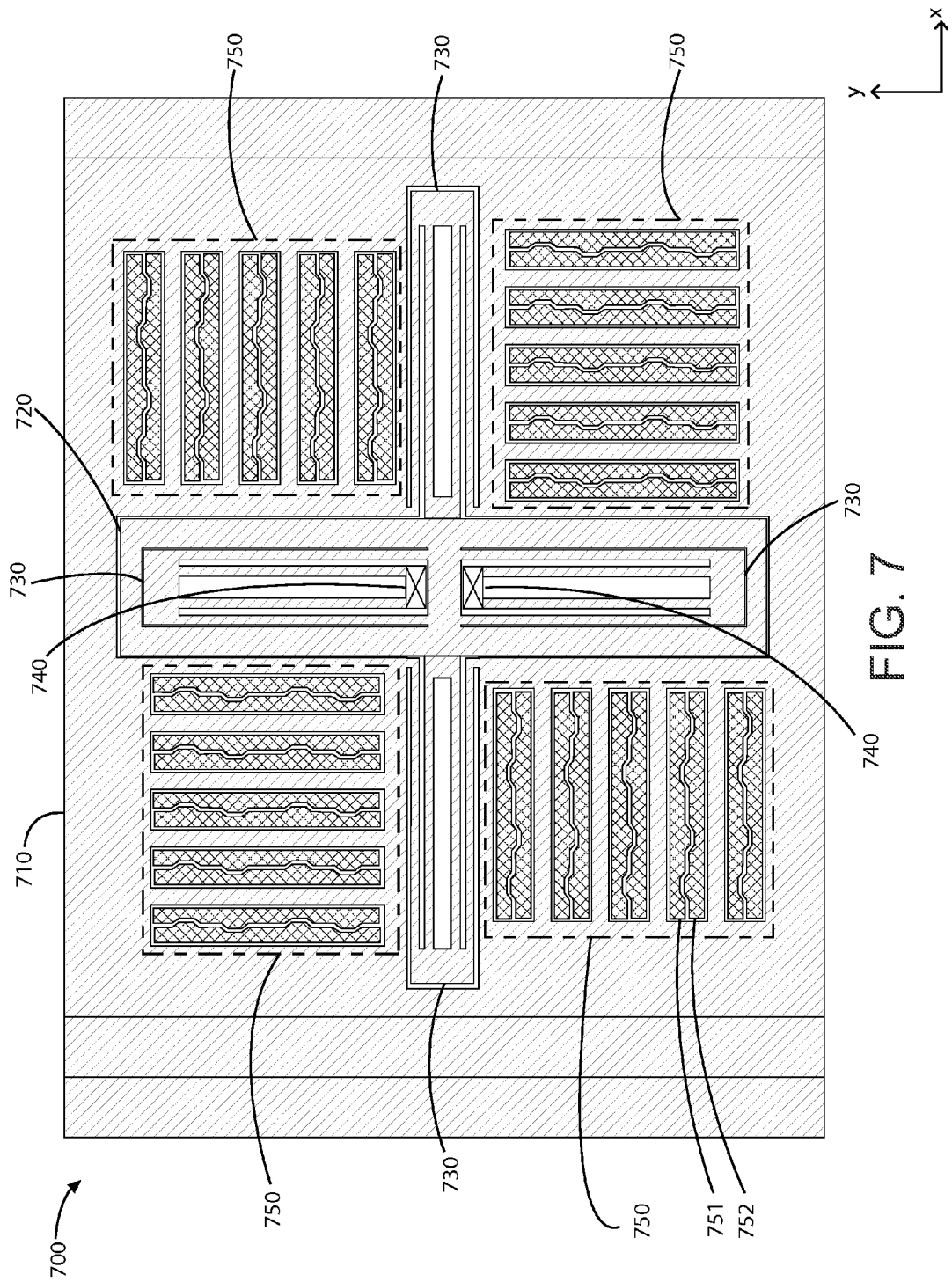
FIG. 7 is a simplified diagram of a top view of an integrated MEMS inertial sensor device according to an embodiment of the present invention.

FIG. 7 illustrates a simplified diagram of a top view of an integrated MEMS inertial sensor device according to an embodiment of the present invention. As shown, device 700 can include a proof mass 710, a frame structure 720, spring structures 730, anchor structures 740, and electrodes 750. Device 700 can represent an embodiment similar to the single proof mass device shown in FIG. 3. Various specific embodiments are described below.

Proof mass 710 can be an XYZ proof mass that can be coupled to two of the springs 730, which are doubly-folded springs. These doubly-folded springs can be coupled to the frame 720, which is coupled to the anchors 740 by two other doubly-folded springs 730. These doubly-folded springs can provide both translational motion and rotational motion. The springs 730 can be configured in a symmetrical cross arrangement.

Electrodes 750, which can include differential electrode members 751 and 752, can be configured as sense electrodes, test electrodes, and the like. These electrodes can be similar to those described for electrodes 550 in FIG. 5. Here, each group of electrodes 750 includes 5 pairs of members 751 and 752.

Figure 8:
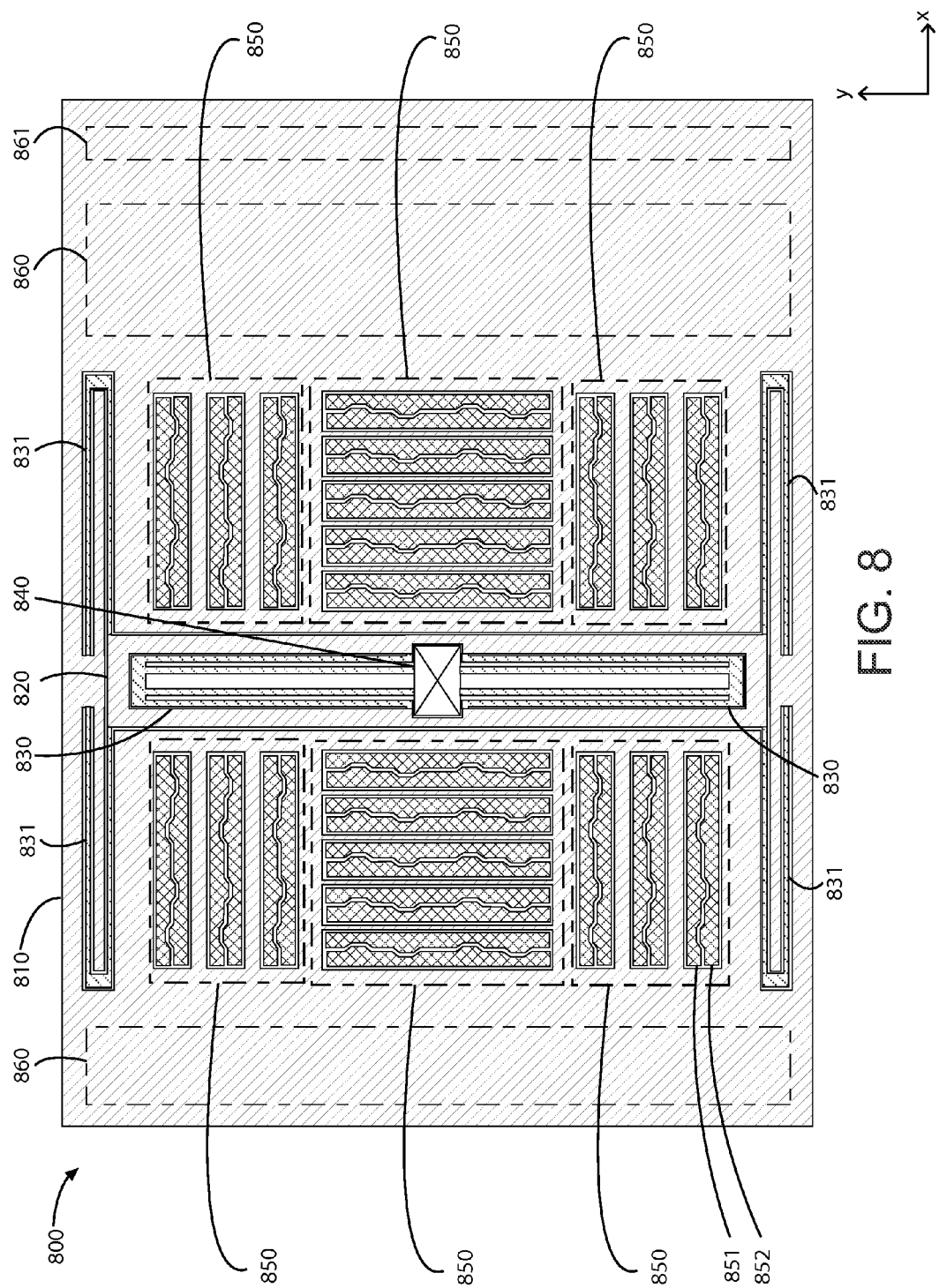
FIG. 8 is a simplified diagram of a top view of an integrated MEMS inertial sensor device according to an embodiment of the present invention.

FIG. 8 illustrates a simplified diagram of a top view of an integrated MEMS inertial sensor device according to an embodiment of the present invention. As shown, device 800 can include a proof mass 810, a frame structure 820, spring structures 830 and 831, an anchor structure 640, and electrodes 650. Various specific embodiments are described below.

Proof mass 810 can be an XYZ proof mass that can be coupled to spring structures 831, which can be single folded springs configured as Y direction springs. Frame 820 can be coupled to single folded springs 831 and can be coupled to anchor 840 by spring structures 830, which can be doubly-folded springs configured as XZ direction springs. Here, springs 830 and 831 can be configured in an "I" arrangement, wherein the doubly-folded springs 830 are parallel to the y-axis and the single folded springs 831 are parallel to the x-axis.

Electrodes 850, which can include differential electrode members 851 and 852, can be configured as sense electrodes, test electrodes, and the like. These electrodes can be similar to those described for electrodes 550 in FIG. 5. Here, electrodes 850 include four groups configured parallel to the x-axis and two groups parallel to the y-axis. The groups that are parallel to the x-axis can include 3 pairs of members 851 and 852, whereas the groups that are parallel to the y-axis can include 5 pairs of members 851 and 852. Furthermore, device 800 can include Z sense electrodes 860 and a Z test electrodes 861, which can be configured underlying device 800. Here, the group orientations and numbers can be adapted for various designs and applications.

In FIG. 8, the out-of-plane stiffness is chosen such that the teeter totter movement of the proof-mass is sufficient for z-axis sensitivity. Furthermore, errors due to process imperfections can be minimized by using geometrically symmetrical designs.

Based on the above principles, the design embodiments of the accelerometers are compact due to the spring designs, and are accurate due to symmetry.

Appropriate spring geometries are determined by extensive analytical and finite element based analysis, which has been done to minimize motion errors (i.e. parasitic coupling between axes).

In various embodiments, identical building blocks are used in a given accelerometer. However, this need not be the case. In alternative embodiments, the following configurations can be used:

Different building blocks in the same inertial sensor design, e.g. using a combination of single and doubly folded beams to construct a spring design Varying the geometric parameters from unit to unit, i.e., the spring units used in an accelerometer need not all be identical. The blade length, thickness, and spacing can all be varied from one unit to another.

The present invention provides a method and structure for an integrated MEMS inertial sensor device. In an embodiment, the method can include providing a substrate member having a surface region and forming at least one proof mass structure, at least one first anchor structure, and at least one first spring structure overlying the surface region. The first spring structure can be coupled to the proof mass structure and the first anchor structure.

In a specific embodiment, the forming of the proof mass structure can include forming a first proof mass member coupled to a first frame structure via at least a second spring structure. The first frame structure can be coupled to the first anchor structure via the first spring structure. The first frame structure can also be formed surround the perimeter of the first proof mass member.

In a specific embodiment, the method can also include forming a second proof mass member, at least one second anchor structure, a second frame structure, and at least one third spring structure overlying the surface region. The second proof mass member can be formed with a center cavity and the second frame structure can be formed within the center cavity of the second proof mass member. The second frame structure can be coupled to the second anchor structure and the proof mass structure can be formed within the second frame structure.

In a specific embodiment, the first, second, and third spring structure can include various spring types and combinations. Each of these can include single beam springs, single folded springs, doubly-folded springs, and others and combinations thereof. These spring structures can also be configured can various arrangements, such as "I", "H", cross, and other shaped arrangements.

In a specific embodiment, the first proof mass can be formed with a center cavity. The first frame structure and the first anchor structure can be formed within this center cavity. The first proof mass structure, the first anchor structure, and the first and second spring structures can be formed in a geometrically symmetric or anti-symmetric arrangement. The first and second spring structures can also be formed in a rectangular arrangement within a vicinity of the perimeter of the proof mass structure.

In a specific embodiment, the method can include forming at least one electrode structure coupled to the surface region. An IC layer can also be formed overlying the surface region, the IC layer being electrically coupled to the electrode structure. The electrode structure can include a differential electrode pair. The proof mass structure can also be formed with a plurality of electrode cavities. The electrode structure can include a plurality of differential electrode pairs, and each of these pairs can be formed within each of the electrode cavities. The resulting device can include any combination of the aforementioned elements and can represent various embodiments described previously.

In an embodiment, the present invention provides a method and structure for an integrated MEMS inertial sensor device. The method can include providing a substrate member having a surface region with an IC layer formed overlying. A proof mass member can also be formed overlying the surface region. The proof mass member can be formed with a center cavity and a plurality of electrode cavities. A frame structure can be formed overlying the surface region. The frame structure being formed within the center cavity. At least two anchor structures can be formed and coupled to the surface region within the center cavity. At least two doubly-folded spring structures can be formed and coupled to the anchor structures and the frame structure. And a plurality of electrode structures can be formed and coupled to the surface region. Each of the plurality of electrode structures can be formed within one of the plurality of electrode cavities. The plurality of electrode structures can be electrically coupled to the IC layer.

In specific embodiment, the method can include forming a teeter totter proof mass overlying the surface region. Two teeter totter anchor structures and two teeter totter spring structures can also be formed overlying the surface region. The teeter totter spring structures can be coupled to the teeter totter anchor structures and the teeter totter proof mass.

In a specific embodiment, forming the electrode structure can include forming four groups of differential electrode pairs. Two of the groups can be formed parallel to the x-axis, and two of the groups can be formed parallel to the y-axis. Each of the differential electrode pairs of each group can be formed within one of the plurality of electrode cavities in an anti-symmetrical arrangement. The resulting device can include any combination of the aforementioned elements and can represent various embodiments described previously.

In a specific embodiment, the present invention provides an integrated MEMS inertial sensor device. The device can include a substrate member having a surface region and a proof mass member overlying the surface region. The proof mass member can have an "I" shaped center cavity and a plurality of electrode cavities. The device can also include a frame structure overlying the surface region. The frame structure can be configured within the center cavity. The device can also include an anchor structure coupled to the surface region. The anchor structure can be configured within the center cavity and within the frame structure.

The device can also include two doubly-folded spring structures coupled to the anchor structure and the frame structure. The doubly-folded spring structures can be configured to be parallel to the y-axis. The device can also include four single folded spring structures coupled to the frame structure and the proof mass member. The four single-folded spring structures can be configured to be parallel to the x-axis. The two single folded spring structures and the two doubly-folded spring structures can be configured within the center cavity in an "I" shaped arrangement. Also, the device can include a plurality of electrode structures coupled to the surface region. Each of the plurality of electrode structures can be configured within one of the plurality of electrode cavities.

In a specific embodiment, the electrode structure can include six groups of differential electrode pairs. Four of the groups can be configured to be parallel to the x-axis. Two of the groups can be configured to be parallel to the y-axis. Each of the differential electrode pairs of each group can be configured within one of the plurality of electrode cavities in a symmetrical arrangement.

Figure 9:
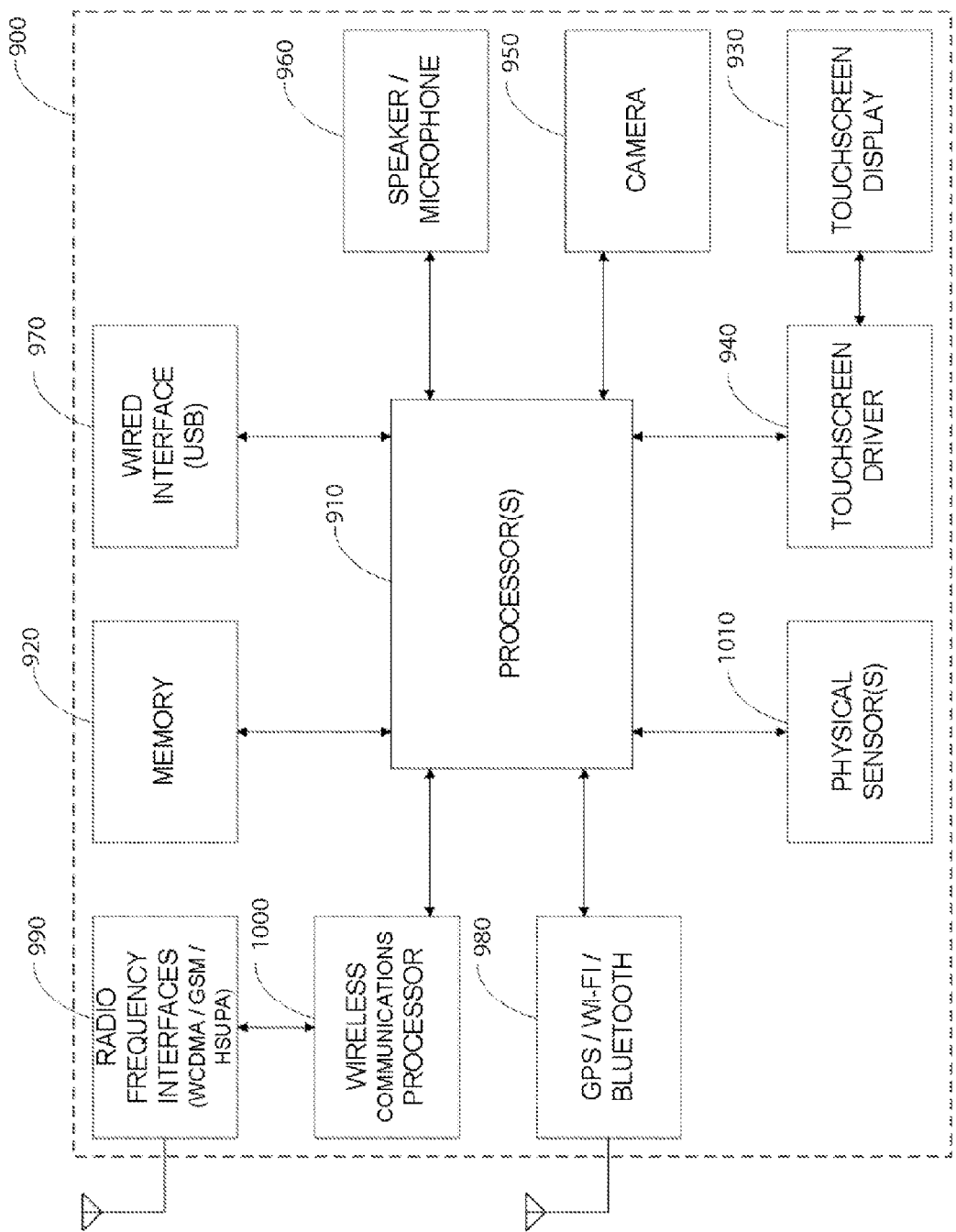
FIG. 9 illustrates a simplified functional block diagram of various embodiments of the present invention.

FIG. 9 illustrates a functional block diagram of various embodiments of the present invention. In FIG. 9, a computing device 900 typically includes an applications processor 910, memory 920, a touch screen display 930 and driver 940, an image acquisition device 950, audio input/output devices 960, and the like. Additional communications from and to computing device are typically provided by via a wired interface 970, a GPS/Wi-Fi/Bluetooth interface 980, RF interfaces 990 and driver 1000, and the like. Also included in various embodiments are physical sensors 1010.

In various embodiments, computing device 900 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 900 may include one or more processors 910. Such processors 910 may also be termed application processors, and may include a processor core, a video/graphics core, and other cores. Processors 910 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 920 may include different types of memory (including memory controllers), such as flash memory (e.g. NOR, NAND), pseudo SRAM, DDR SDRAM, or the like. Memory 920 may be fixed within computing device 900 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 930 and driver 940 may be based upon a variety of later-developed or current touch screen technology including resistive displays, capacitive displays, optical sensor displays, electromagnetic resonance, or the like. Additionally, touch screen display 930 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 950 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 960 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 910 to enable the user to operate computing device 900 by stating voice commands. Additionally, a speech engine may be provided in various embodiments to enable computing device 900 to provide audio status messages, audio response messages, or the like.

In various embodiments, wired interface 970 may be used to provide data transfers between computing device 900 and an external source, such as a computer, a remote server, a storage network, another computing device 900, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 980 may also be provided to provide wireless data transfers between computing device 900 and external sources, such as computers, storage networks, headphones, microphones, cameras, or the like. As illustrated in FIG. 9, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 9, GPS functionality is included as part of wireless interface 980 merely for sake of convenience, although in implementation, such functionality is currently performed by circuitry that is distinct from the Wi-Fi circuitry and distinct from the Bluetooth circuitry.

Additional wireless communications may be provided via RF interfaces 990 and drivers 1000 in various embodiments. In various embodiments, RF interfaces 990 may support any future-developed or conventional radio frequency communications protocol, such as CDMA-based protocols (e.g. WCDMA), GSM-based protocols, HSUPA-based protocols, or the like. In the embodiments illustrated, driver 1000 is illustrated as being distinct from applications processor 910. However, in some embodiments, these functionalities are provided upon a single IC package, for example the Marvel PXA330 processor, and the like. It is contemplated that some embodiments of computing device 900 need not include the RF functionality provided by RF interface 990 and driver 1000.

FIG. 9 also illustrates computing device 900 to include physical sensors 1010. In various embodiments of the present invention, physical sensors 1010 can be single axis or multi-axis Micro-Electro-Mechanical Systems (MEMS) based devices being developed by M-cube, the assignee of the present patent application. Physical sensors 1010 can include accelerometers, gyroscopes, pressure sensors, magnetic field sensors, bio sensors, and the like. In other embodiments of the present invention, conventional physical sensors 1010 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 930 and driver 940 and inputs/or outputs to physical sensors 1010 may be processed in parallel processing threads. In other embodiments, such events or outputs may be processed serially, or the like. Inputs and outputs from other functional blocks may also be processed in parallel or serially, in other embodiments of the present invention, such as image acquisition device 950 and physical sensors 1010.

FIG. 9 is representative of one computing device 900 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 9. For example, in various embodiments, computing device 900 may lack image acquisition unit 950, or RF interface 990 and/or driver 1000, or GPS capability, or the like. Additional functions may also be added to various embodiments of computing device 900, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated MEMS (Micro-Electro-Mechanical-Systems) inertial sensor device, the device comprising:
a substrate member having a surface region;
a first proof mass overlying the surface region;
a first frame overlying the surface region;
at least one frame spring physically coupled to the first frame and the first proof mass;
at least one first anchor physically coupled to the surface region;
at least one first spring physically coupled to the first frame and the first anchor, the first spring including a doubly-folded spring;
wherein the first proof mass is physically coupled to the first frame via the first spring, the first frame being physically coupled to the first anchor via the first spring;
a second proof mass overlying the surface region, the second proof mass having a center cavity, wherein the first proof mass is spatially disposed within the center cavity;
at least one second anchor physically coupled to the surface region; and
at least one second spring physically coupled to the second proof mass and the second anchor.

2. The device of claim 1 wherein the first frame is configured surrounding the perimeter of the first proof mass.

3. The device of claim 1 wherein the at least one frame spring comprises a doubly-folded spring, a singled folded spring, or a single beam spring.

4. The device of claim 1 wherein the first and second springs are configured with an "H", an "I", or a cross shaped arrangement.

5. The device of claim 1 wherein the second spring comprises a doubly-folded spring, a singled folded spring, or a single beam.

6. The device of claim 1 wherein the first proof mass, the first frame, the first anchor, and the first and frame springs are configured in a geometrically symmetric or anti-symmetric arrangement.

7. The device of claim 1 wherein the first and frame springs are configured in a rectangular arrangement within a vicinity of the perimeter of the first proof mass.

8. The device of claim 1 further comprising at least one electrode structure coupled to the surface region.

9. The device of claim 8 further comprising an IC layer overlying the surface region, the IC layer being electrically coupled to the electrode structure.

10. The device of claim 8 wherein the electrode structure comprises a differential electrode pair.

11. The device of claim 8 wherein the electrode structure is configured symmetrically or anti-symmetrically on the surface region.

12. The device of claim 11 wherein the first proof mass comprises a plurality of electrode cavities, the electrode structure comprising a plurality of differential electrode pairs, each of the plurality of differential electrode pairs being configured within one of the plurality of electrode cavities.

13. An integrated MEMS (Micro-Electro-Mechanical-Systems) inertial sensor device, the device comprising:
a substrate having a surface region;
an IC layer overlying the surface region;
a first proof mass overlying the surface region, the first proof mass having a plurality of electrode cavities;
a second proof mass overlying the surface region, the second proof mass having a center cavity, wherein the first proof mass is configured within the center cavity;
a frame overlying the surface region, the frame being configured within the center cavity, wherein the first proof mass is configured within the frame;
at least two doubly-folded springs physically coupled to the first proof mass and the frame;
at least two first anchors physically coupled to the surface region, the first anchors being configured within the center cavity;
at least two doubly-folded springs physically coupled to the first anchors and the frame;
at least two second anchors physically coupled to the surface region, the second anchors being configured within the center cavity;
at least two springs physically coupled to the second anchors and the second proof mass; and
a plurality of electrode structures coupled to the surface region, each of the plurality of electrode structures being configured within one of the plurality of electrode cavities, the plurality of electrode structures being electrically coupled to the IC layer.

14. The device of claim 13 wherein the second proof mass comprises a teeter totter proof mass overlying the surface region.

15. The device of claim 13 wherein the plurality of electrode structures comprises four groups of differential electrode pairs, two of the groups configured to be parallel to the x-axis, two of the groups configured to be parallel to the y-axis, each of the differential electrode pairs being configured within one of the plurality of electrode cavities in an anti-symmetrical arrangement.

* * * * *